United States Patent
Park

(10) Patent No.: US 9,798,480 B2
(45) Date of Patent: Oct. 24, 2017

(54) MEMORY SYSTEM AND OPERATION METHOD THEREOF

(71) Applicant: SK hynix Inc., Gyeonggi-do (KR)

(72) Inventor: Jeen Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 15/177,171

(22) Filed: Jun. 8, 2016

(65) Prior Publication Data

US 2017/0185329 A1    Jun. 29, 2017

(30) Foreign Application Priority Data

Dec. 29, 2015 (KR) .................. 10-2015-0188687

(51) Int. Cl.
G06F 12/02 (2006.01)
G06F 3/06 (2006.01)

(52) U.S. Cl.
CPC ............ *G06F 3/0619* (2013.01); *G06F 3/065* (2013.01); *G06F 3/0611* (2013.01); *G06F 3/0685* (2013.01); *G06F 12/0246* (2013.01); *G06F 12/0253* (2013.01); *G06F 2212/7205* (2013.01)

(58) Field of Classification Search
None
See application file for complete search history.

(56) References Cited

U.S. PATENT DOCUMENTS

| | | | | |
|---|---|---|---|---|
| 8,904,090 B2 * | 12/2014 | Baek | ................... | G06F 12/0246 707/813 |
| 2009/0132761 A1 * | 5/2009 | Yim | ...................... | G06F 3/0613 711/114 |
| 2012/0173797 A1 * | 7/2012 | Shen | ................... | G06F 12/0246 711/103 |
| 2013/0254461 A1 * | 9/2013 | Tan | ...................... | G06F 12/0246 711/103 |
| 2014/0173183 A1 * | 6/2014 | Shin | ................... | G06F 12/0246 711/103 |
| 2014/0380092 A1 * | 12/2014 | Kim | ...................... | G06F 11/108 714/6.24 |
| 2015/0019796 A1 * | 1/2015 | Byun | ................... | G06F 12/0246 711/103 |

FOREIGN PATENT DOCUMENTS

KR    1020100037789    4/2010
KR    1020150054073    5/2015

* cited by examiner

*Primary Examiner* — Kaushikkumar Patel
(74) *Attorney, Agent, or Firm* — IP & T Group LLP

(57) ABSTRACT

A memory system may include: a data storage unit comprising a first memory device through which data are inputted/outputted through a first channel and a second memory device through which data are inputted/outputted through a second channel, wherein each of the first and second memory devices comprises a plurality of blocks each having multi-level cells (MLCs); and a controller suitable for selecting a first target block among the plurality of blocks of a channel which includes a first victim block and selecting a second target block among the plurality of blocks of a channel of which does not include the first victim block, and separating data of the MLCs included in the first victim block on a level basis and copying the separated data into the first and second target blocks, respectively, during a garbage collection operation.

20 Claims, 15 Drawing Sheets

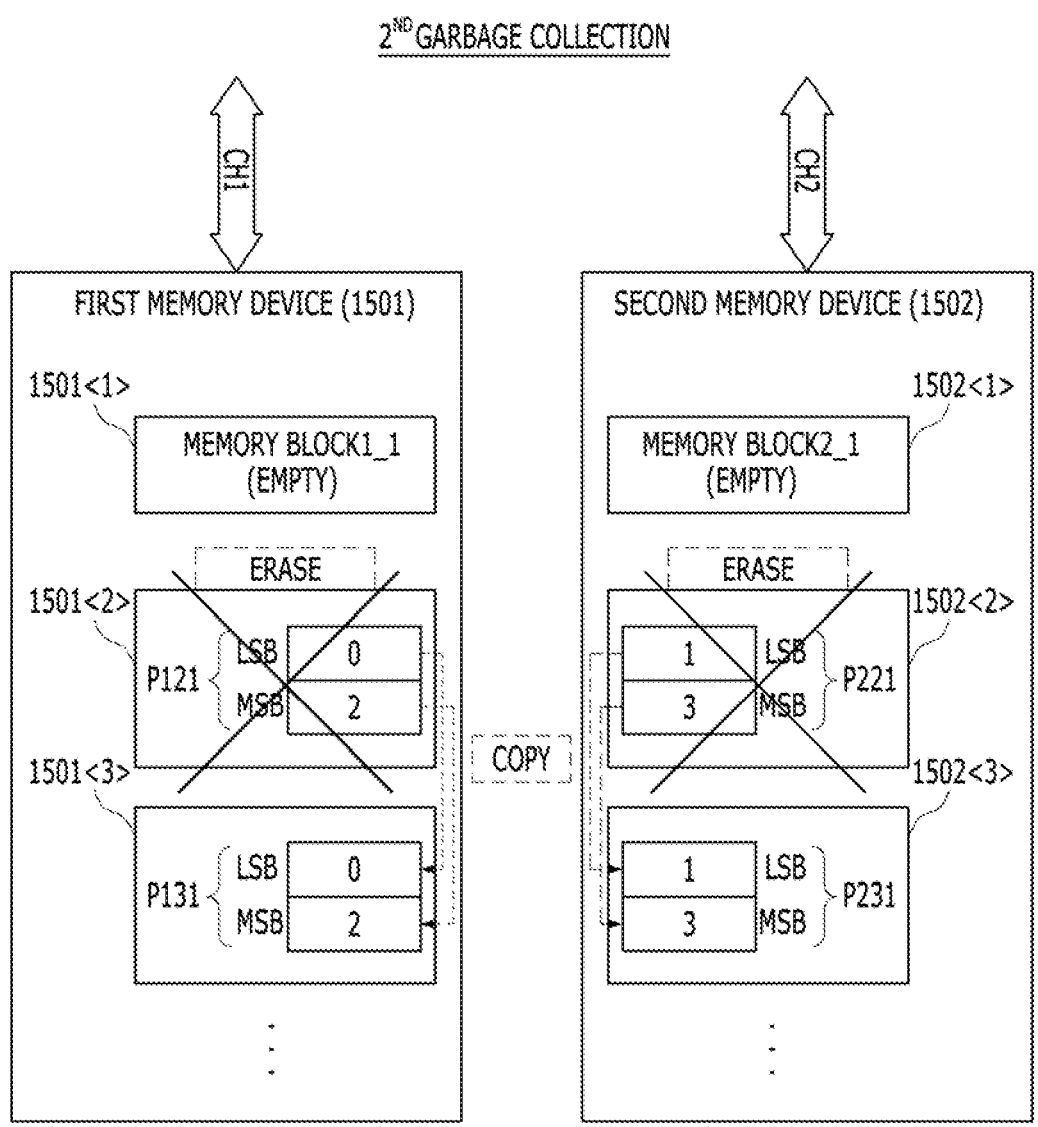

MEMORY SYSTEM AND OPERATION METHOD THEREOF

CROSS-REFERENCE TO RELATED APPLICATIONS

This application claims priority under 35 U.S.C. §119 to Korean Patent Application No. 10-2015-0188687 filed on Dec. 29 2015, the disclosure of which is herein incorporated by reference in its entirety.

BACKGROUND

1. Field

Exemplary embodiments of the present invention relate to a semiconductor design technology, and more particular, to a memory system which supports a garbage collection operation.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a memory system capable of providing an effective garbage collection operation for memory devices which input/output data through different channels, and an operation method thereof.

In an embodiment, a memory system may include: a first group of multi-level cell (MLC) structured memory blocks, in which data are stored by an one-shot program operation, and operable through a first channel; a second group of MLC structured memory blocks, in which data are stored by the one-shot program operation, and operable through a second channel different from the first channel; and a controller suitable for: performing a first garbage collection operation to first victim blocks and first and second target blocks in the first and second groups; and performing a second garbage collection operation to second victim blocks and third target blocks in the first and second groups after the first garbage collection operation. During the first garbage collection operation, copy data of the first victim blocks may be interleaved and stored in the first and second target blocks such that the copy data stored in the first and second target blocks are suitable for an interleaved read operation. During the second garbage collection operation, copy data of the second victim blocks may be stored as is in the third target blocks such that the copy data stored in the third target blocks are still suitable for the interleaved read operation.

During the first garbage collection operation, the controller sequentially may copy the data of the first victim blocks by a unit of a memory block in the first and second groups.

During the first garbage collection operation, in each of the first victim blocks, the controller may copy out the data of the first victim blocks in ascending order from a lower level to an upper level of the respective MLCs in the first and second groups.

During the first garbage collection operation, the controller may store the copied-out data in the target blocks in order from the first target block to the second target block in an ascending level of MLC basis.

When storing data in a first memory block of the first and second groups in response to a host request, the controller may store a first identification information in the first memory block.

When storing data in a second memory block of the first and second groups as a result of the first garbage collection operation, the controller may store a second identification information in the second memory block.

During the first garbage collection operation, the controller may select the first victim blocks in the first and second groups according to the first identification information.

During the second garbage collection operation, the controller may select the second victim blocks in the first and second groups according to the second identification information.

The controller may select the first target blocks in one of the first and second groups, to which the first victim blocks belong, and the controller may select the second target blocks in the other one of the first and second groups, to which the first victim blocks belong.

The controller may select the third target blocks in one of the first and second groups, to which the second victim blocks belong.

In an embodiment, an operation method of a memory system including a first group of multi-level cell (MLC) structured memory blocks in which data are stored by an one-shot program operation and operable through a first channel and a second group of MLC structured memory blocks in which data are stored by the one-shot program operation and operable through a second channel different from the first channel, the operation method may include: performing a first garbage collection operation to first victim blocks and first and second target blocks in the first and second groups; and performing a second garbage collection operation to second victim blocks and third target blocks in the first and second groups after the first garbage collection operation, the performing of the first garbage collection operation interleaves and stores copy data of the first victim blocks in the first and second target blocks such that the copy data stored in the first and second target blocks are suitable for an interleaved read operation, and the performing of the second garbage collection operation, copy data of the second victim blocks are stored as is in the third target blocks such that the copy data stored in the third target blocks are still suitable for the interleaved read operation.

The performing of the first garbage collection operation sequentially may copy the data of the first victim blocks by a unit of a memory block in the first and second groups.

The performing of the first garbage collection operation in each of the first victim blocks, may copy out the data of the first victim blocks in ascending order from a lower level to an upper level of the respective MLCs in the first and second groups.

The performing of the first garbage collection operation may store the copied-out data in the target blocks in order from the first target block to the second target block in an ascending level of MLC basis.

The operation method may further include, when storing data in a first memory block of the first and second groups in response to a host request, storing a first identification information in the first memory block.

The operation method may further include, when storing data in a second memory block of the first and second groups as a result of the first garbage collection operation, storing a second identification information in the second memory block.

The performing of the first garbage collection operation may select the first victim blocks in the first and second groups according to the first identification information.

The performing of the second garbage collection operation may select the second victim blocks in the first and second groups according to the second identification information.

The performing of the first garbage collection operation may select the first target blocks in one of the first and second groups, to which the first victim blocks belong, and the performing of the first garbage collection operation may select the second target blocks in the other one of the first and second groups, to which the first victim blocks belong.

The performing of the second garbage collection operation may select the third target blocks in one of the first and second groups, to which the second victim blocks belong.

BRIEF DESCRIPTION OF THE DRAWINGS

FIGS. 13A to 13C are diagrams for describing an exemplary operation of the memory system of FIGS. 12A and 12B.

DETAILED DESCRIPTION

Figure 1:
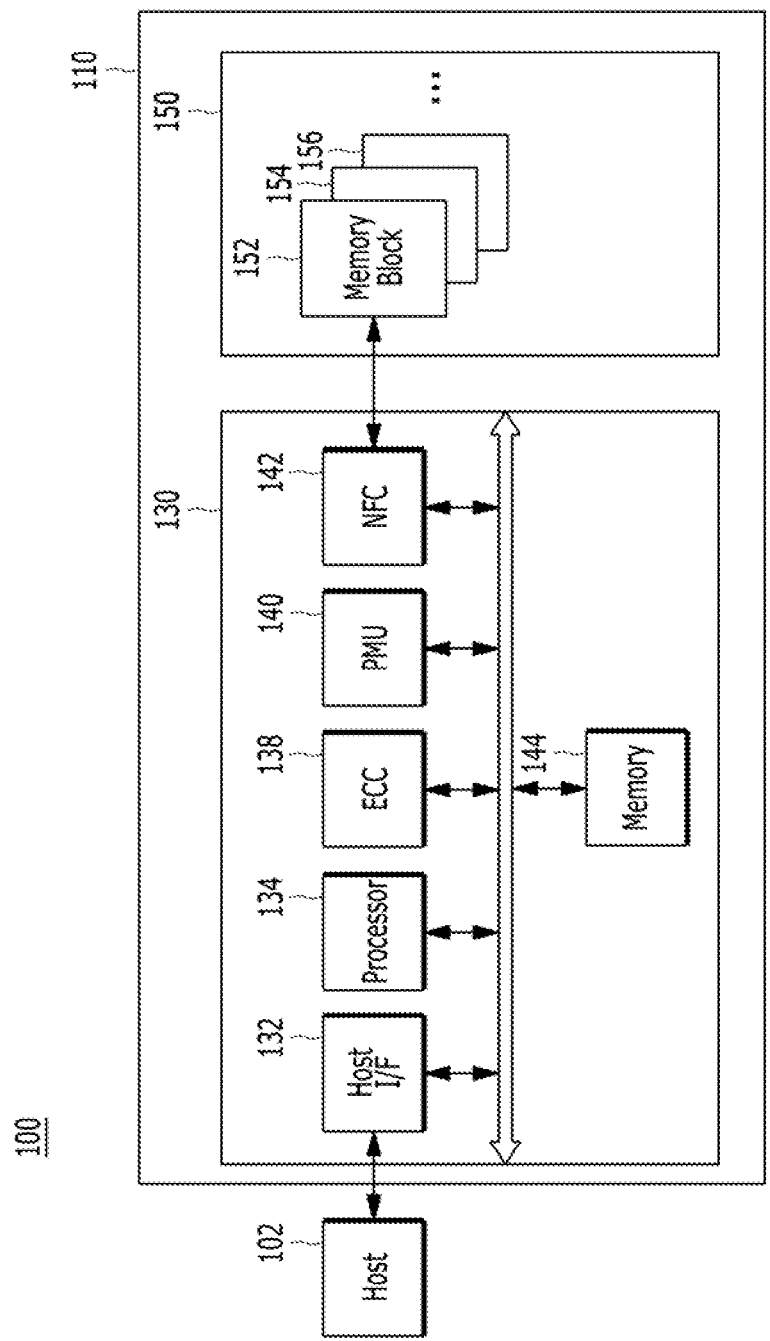
FIG. 1 is a diagram illustrating a data processing system including a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data processing system including a memory system in accordance with an embodiment.

Referring to FIG. 1, a data processing system 100 may include a host 102 and a memory system 110.

The host 102 may include, for example, a portable electronic device such as a mobile phone, an MP3 player and a laptop computer or an electronic device such as a desktop computer, a game player, a TV and a projector.

The memory system 110 may operate in response to a request from the host 102, and in particular, store data to be accessed by the host 102. That is, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC) a reduced size MMC (RS-MMC) and a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when a power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 into the memory device 150. Therefore, the controller 130 may control overall operations of the memory device 150, such as read, write, program and erase operations.

In detail, the controller 130 may include a host interface unit 132, a processor 134, an error correction code (ECC) unit 138, a power management unit 140, a NAND flash controller 142, and a memory 144.

The host interface unit 132 may process commands'and data provided from the host 102, and may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory a write buffer, a read buffer, a map buffer, and so forth.

The processor 134 may control general operations of the memory system 110 and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
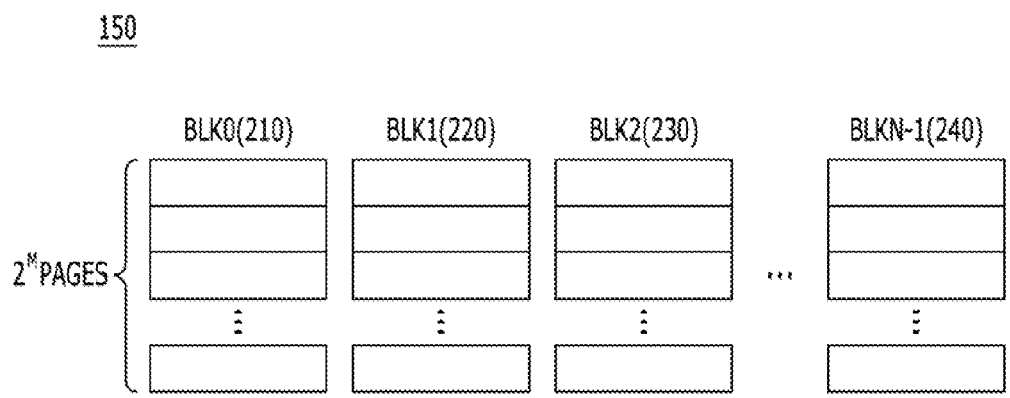
FIG. 2 is a diagram illustrating a memory device in the memory system shown in FIG. 1.

FIG. 2 is a schematic diagram illustrating the memory device 150 shown in FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Additionally, the memory device 150 may include a plurality of memory blocks, as single level cell (SLC) memory blocks and multi-level cell (MLC) memory blocks according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the, host 102 during a read operation.

Figure 3:
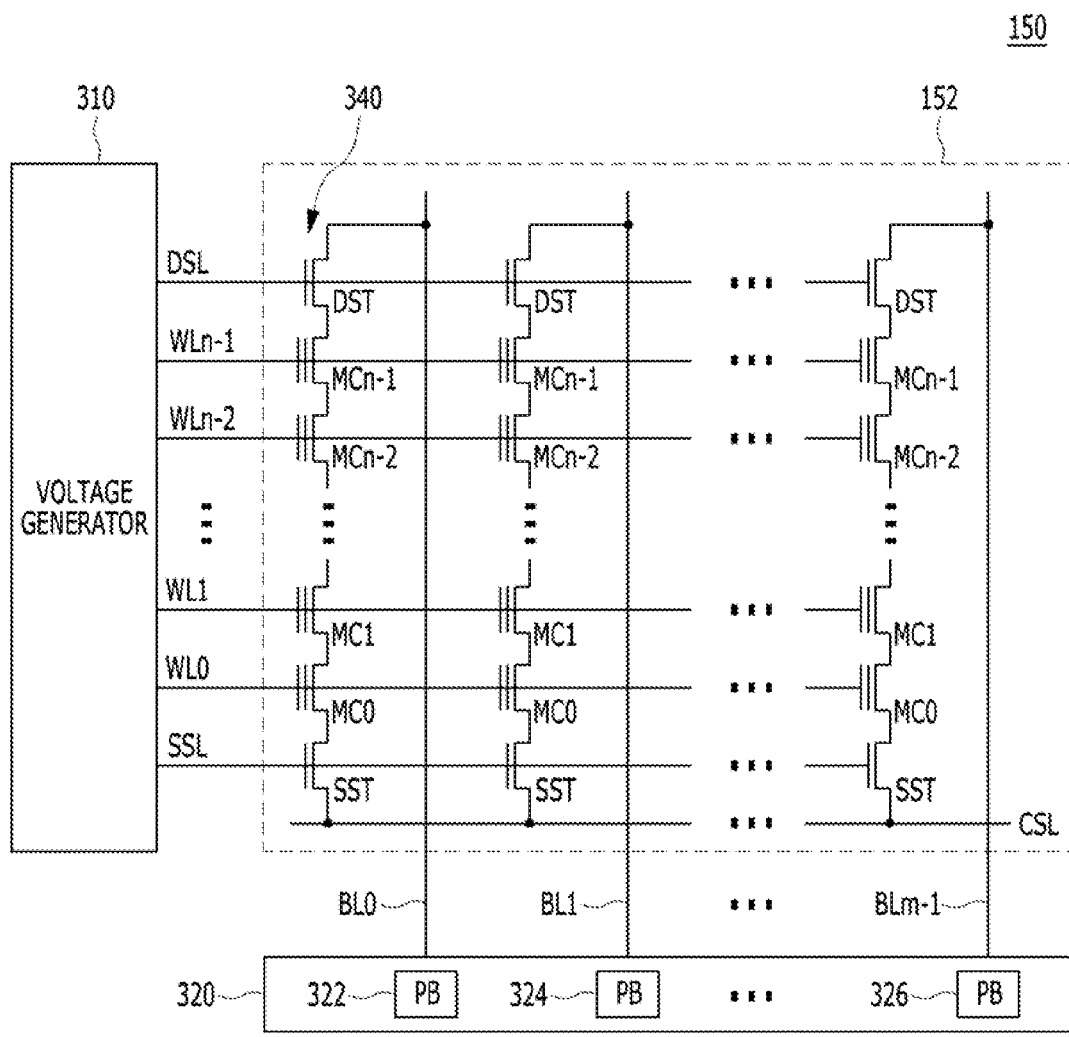
FIG. 3 is a circuit diagram illustrating a memory block in a memory device in accordance with an embodiment.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages, for example, a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the r Memory device 150 may be controlled by the control circuit, and may serve as a sense amplifier or a write driver according to an operation mode. During a verification/normal read operation, the read/write circuit 320 may serve as a sense amplifier for reading data from the memory cell array. Additionally, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. The read/write circuit 320 may include a plurality of page buffers 322, 324 and 326 respectively corresponding to columns or bit lines, or pairs of columns or pairs of bit lines, and a plurality of latches (not shown) may be included in each of the page buffers 322, 324 and 326.

FIGS. 4 to 11 are schematic diagrams illustrating the memory device 150 shown in FIG. 1.

Figure 4:
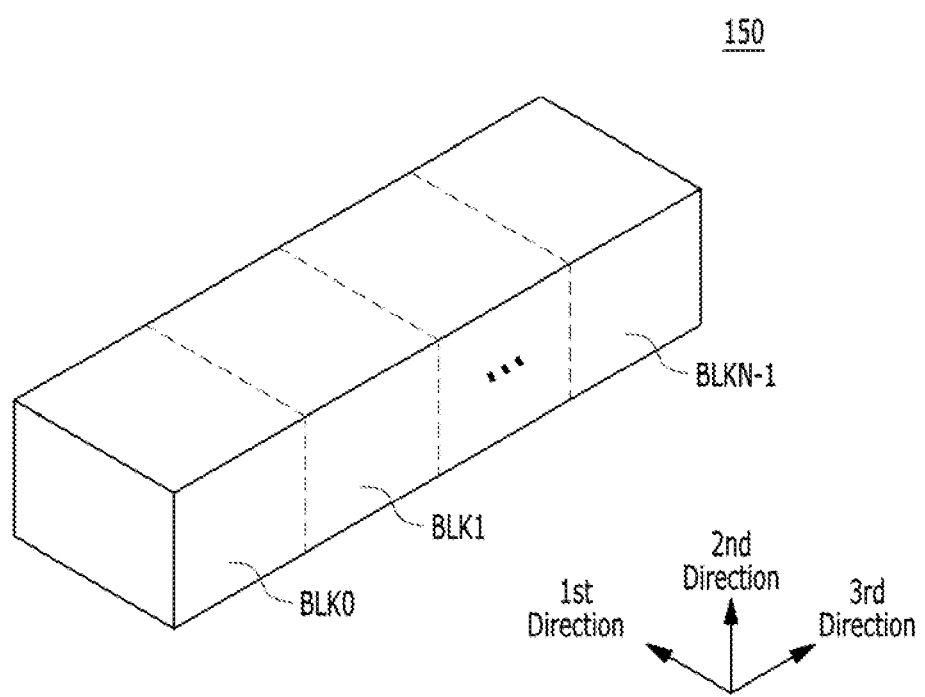
FIGS. 4 to 11 are diagrams schematically illustrating the memory device shown in FIG. 2.

FIG. 4 is a block diagram illustrating an example of the plurality of memory blocks 152 to 156 of the memory device 150 shown in FIG. 1.

Referring to FIG. 4, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction a y-axis direction and a z-axis direction.

The respective memory blocks BLK0 to BLKN-1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. That is, the respective memory blocks BLK0 to BLKN-1 may be electrically coupled to a plurality of bit lines BL, a plurality of source select lines SSL, a plurality of ground select lines GSL, a plurality of word lines WL a plurality of dummy word lines DWL, and a plurality of common source lines CSL.

Figure 5:
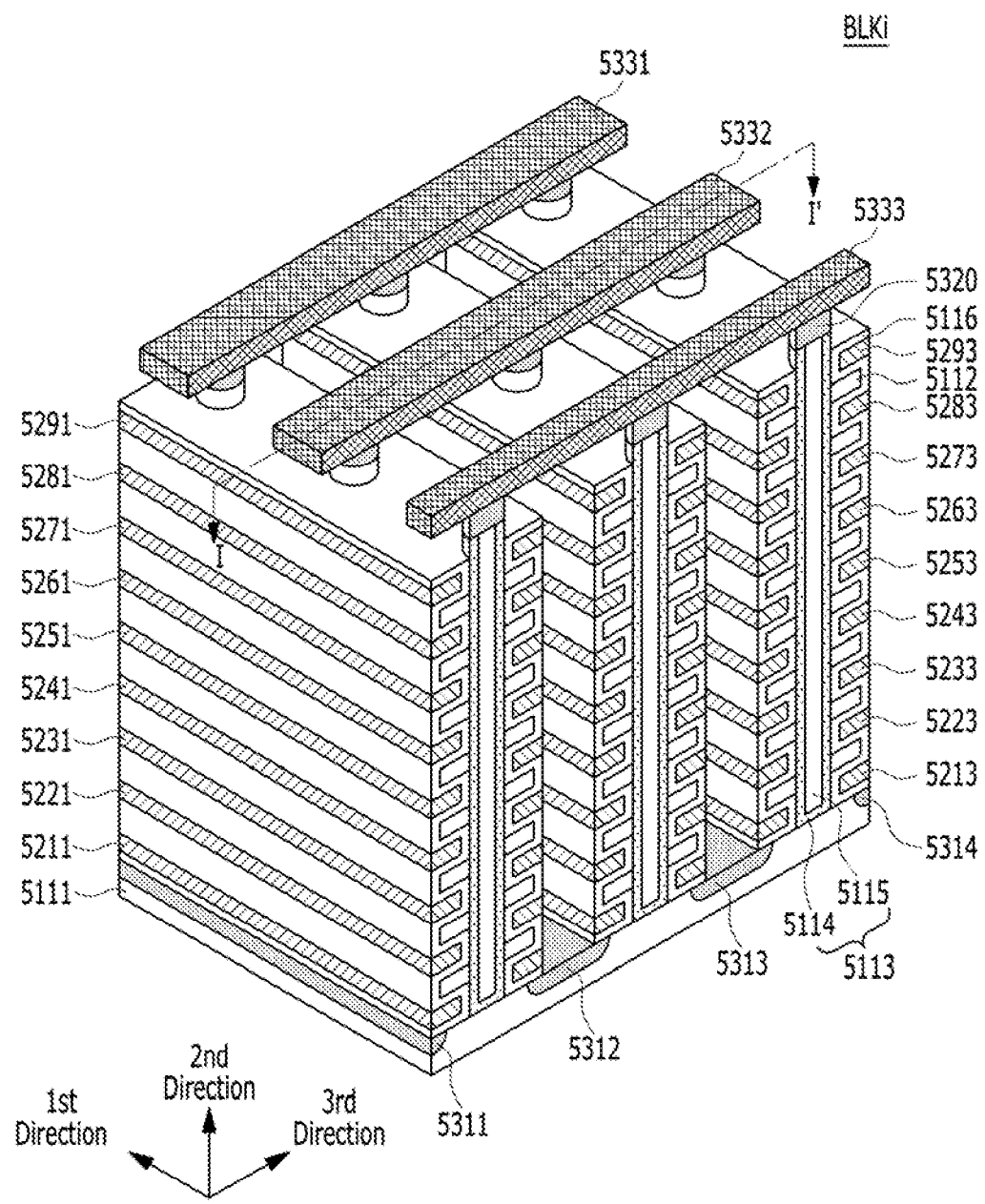
Figure 6:
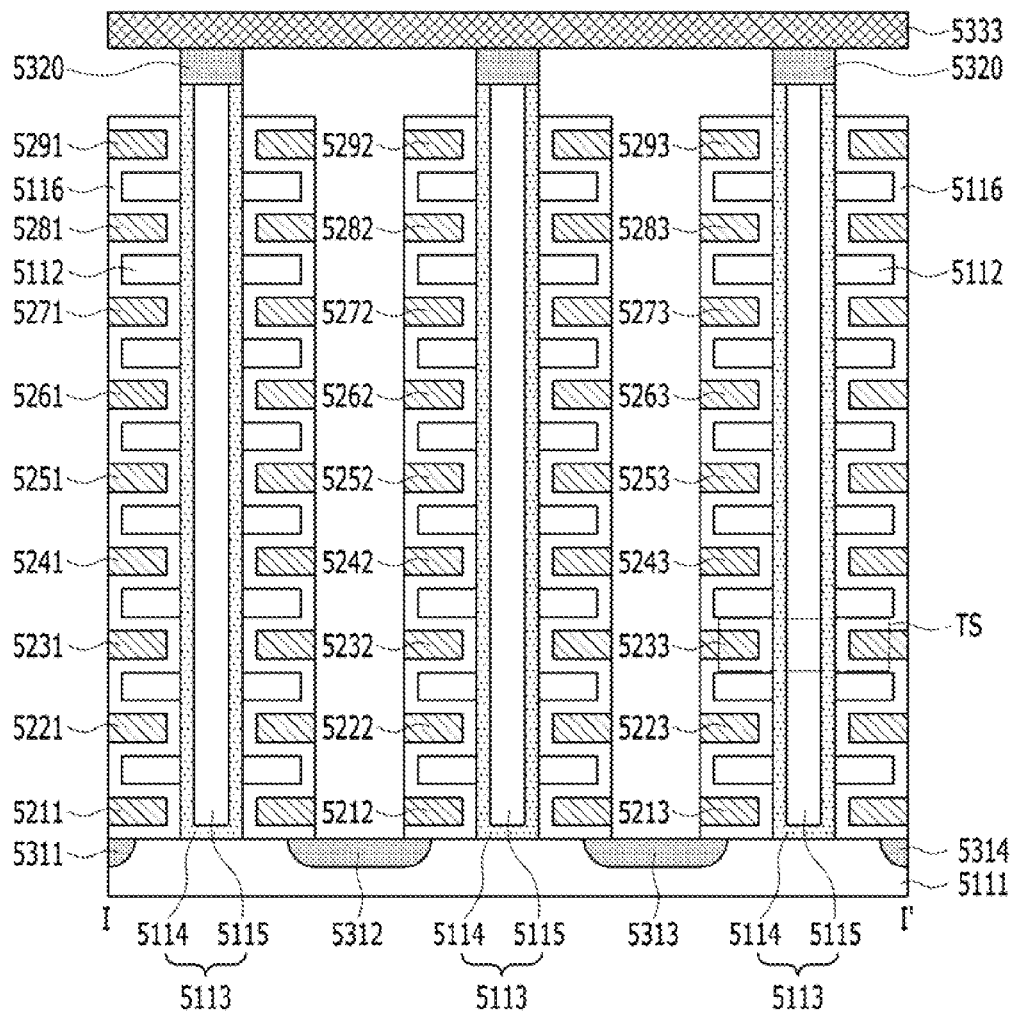

FIG. 5 is a perspective view of one BLKi of the plural memory blocks BLK0 to BLKN-1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may include a silicon material doped with a first type impurity. The substrate 5111 may include a silicon material doped with a p-type impurity or may be a p-type well, for example, a pocket p-well, and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. Although in this embodiment the first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 511 may be separated from one another by predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. That is, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction nay be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. Although in this embodiment the drains 5320 include n-type silicon, it is to be noted that the drains 5320 are not limited to being n-type silicon. Furthermore, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
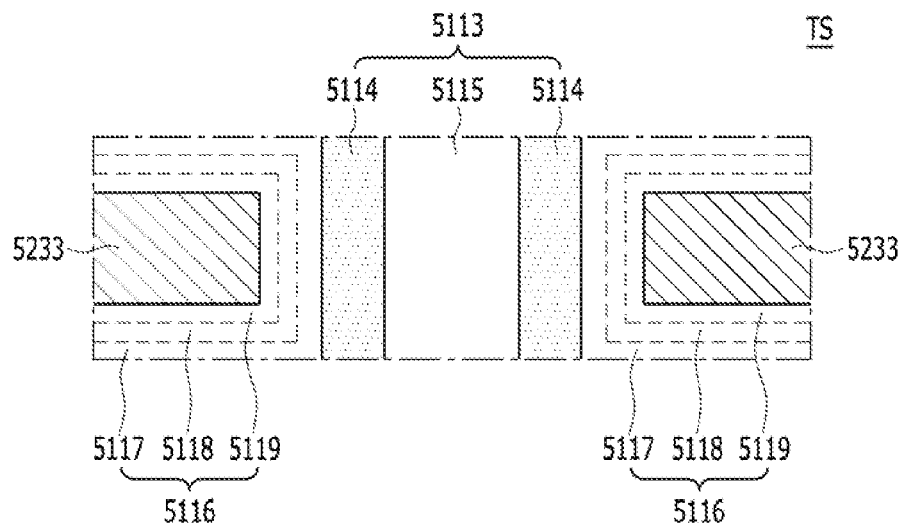

FIG. 7 is a cross-sectional view the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. That is, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. That is, the gates or the control gates may extend in the first direction and form word lines, at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Furthermore, the memory block BLKi may include a plurality of NAND strings NS which extend in a direction perpendicular to the substrate 5111, such as, the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. That is, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
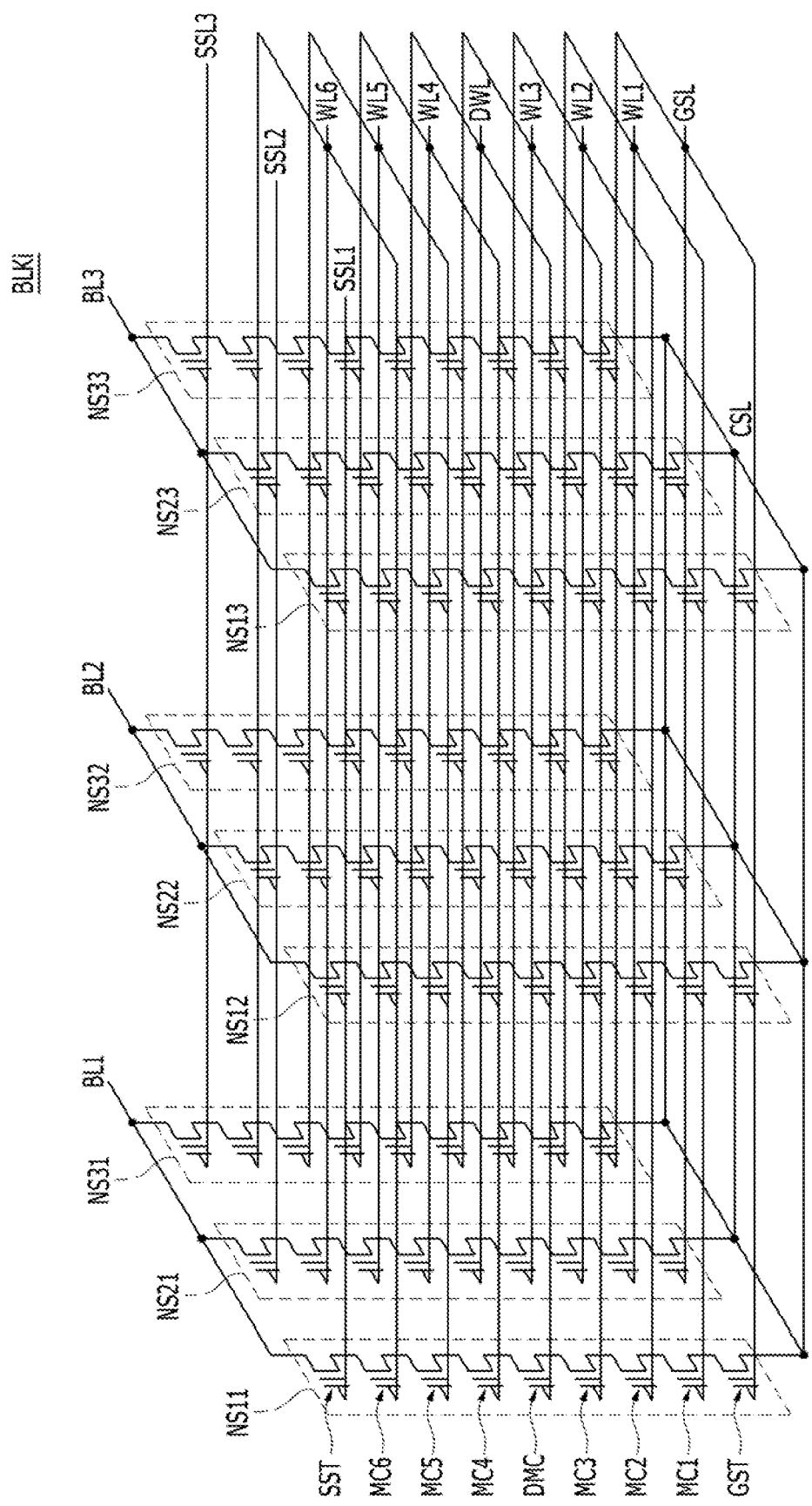

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns, and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. That is, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. The ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

As shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
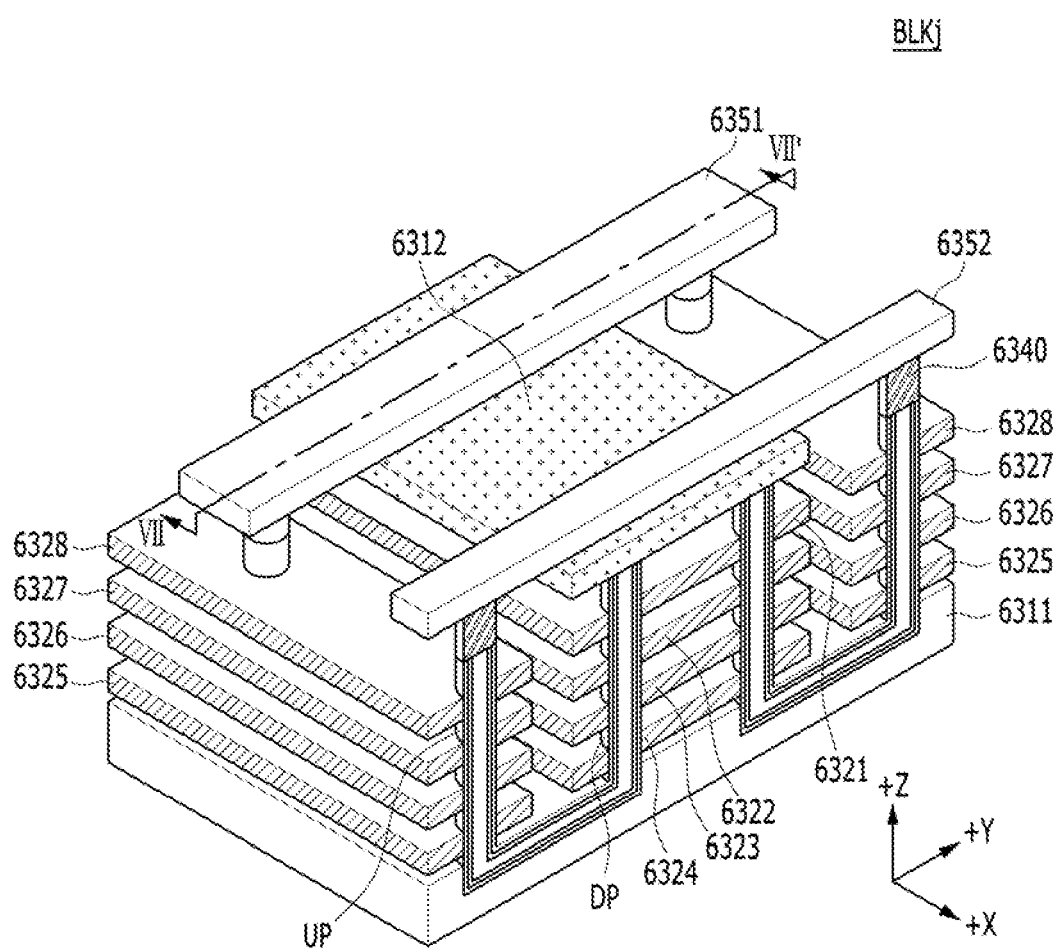

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
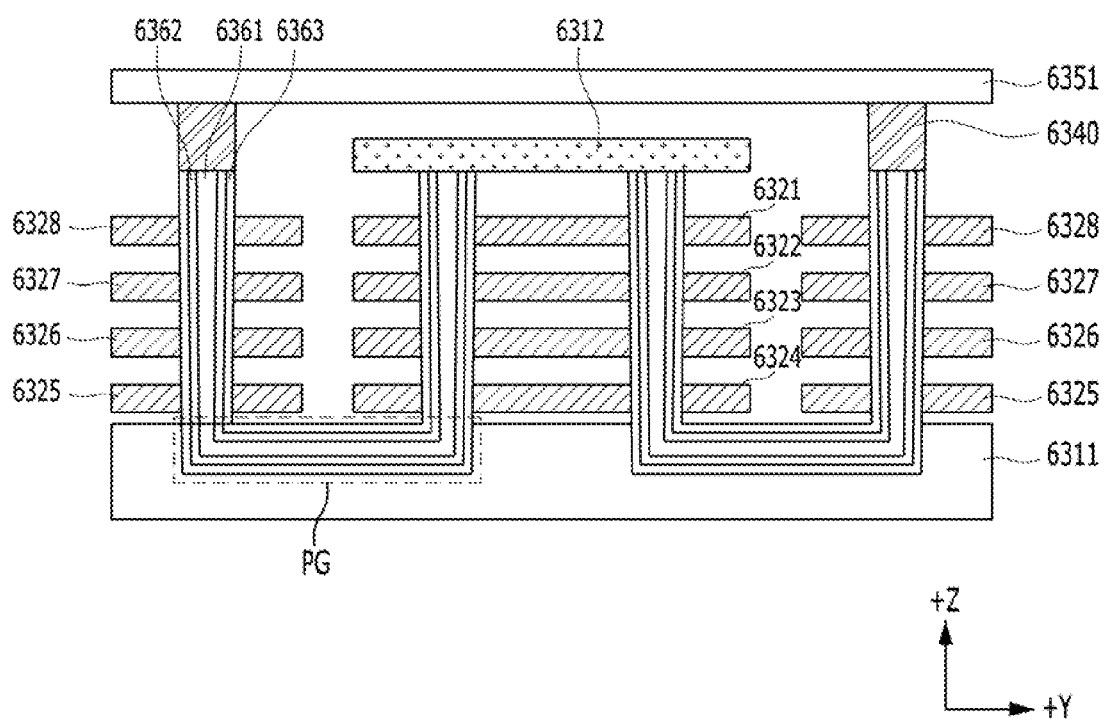

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. Although in this embodiment the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Additionally, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6 52 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
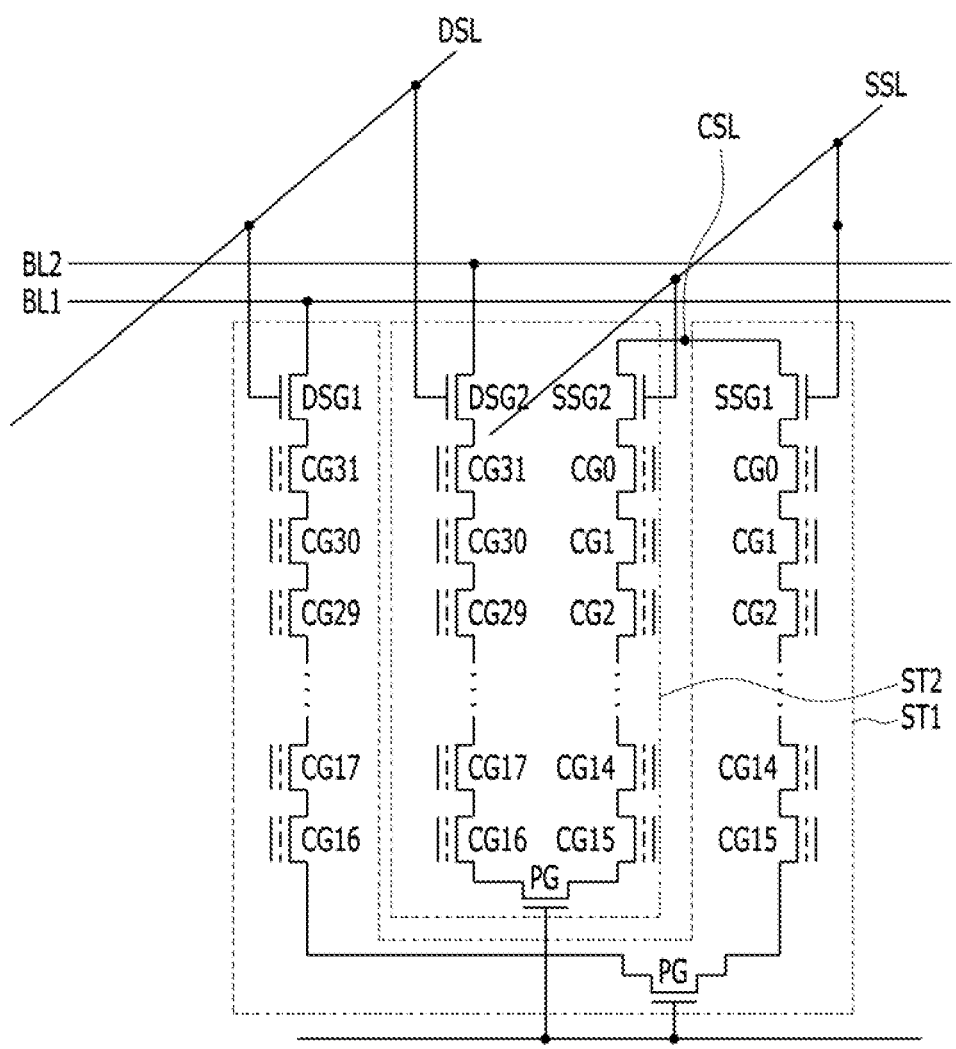

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

That is, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL 2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Figure 12A:
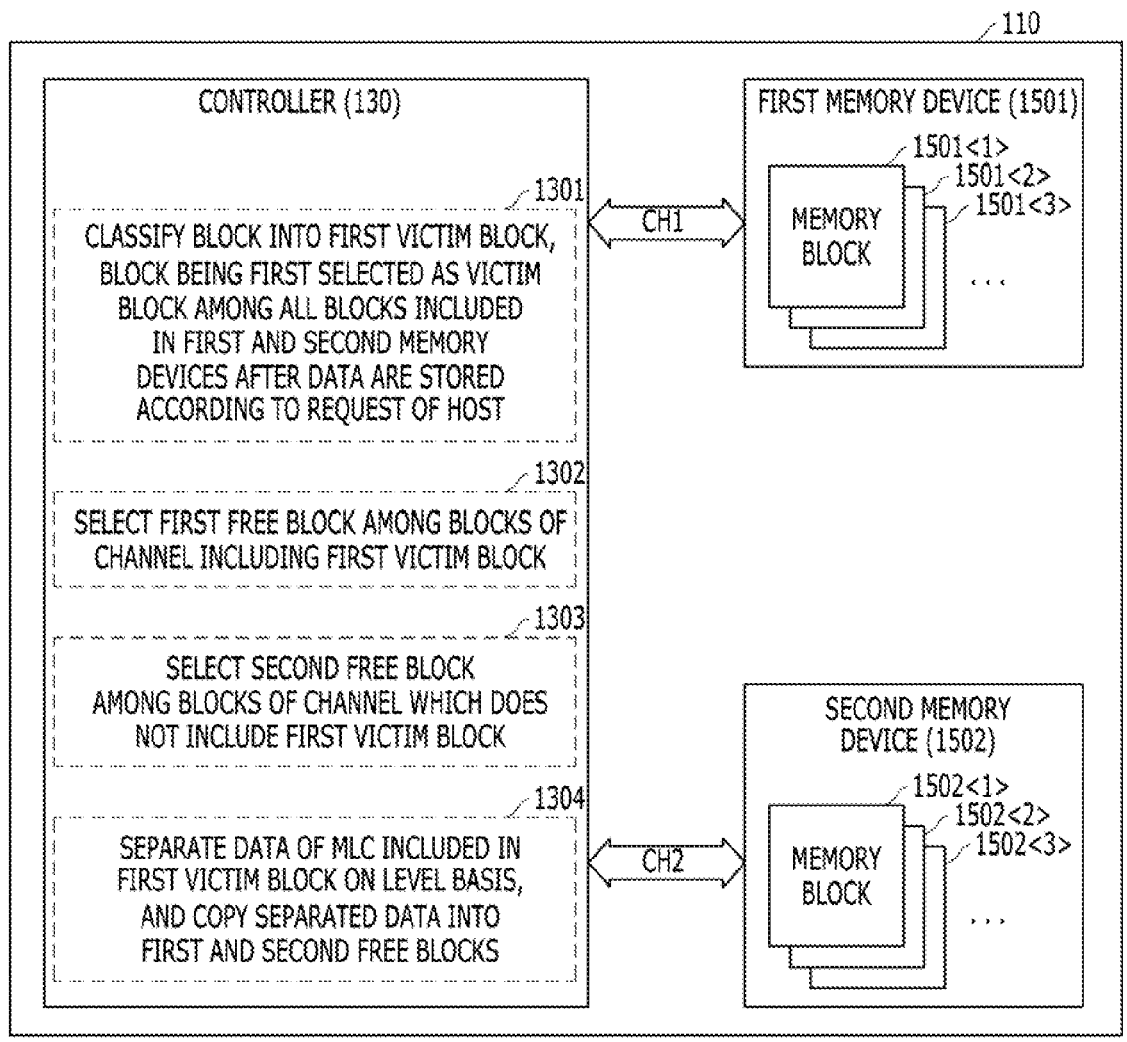
FIGS. 12A and 12B are diagrams illustrating the configuration and operation of a memory system in accordance with an embodiment of the present invention.
Figure 12B:
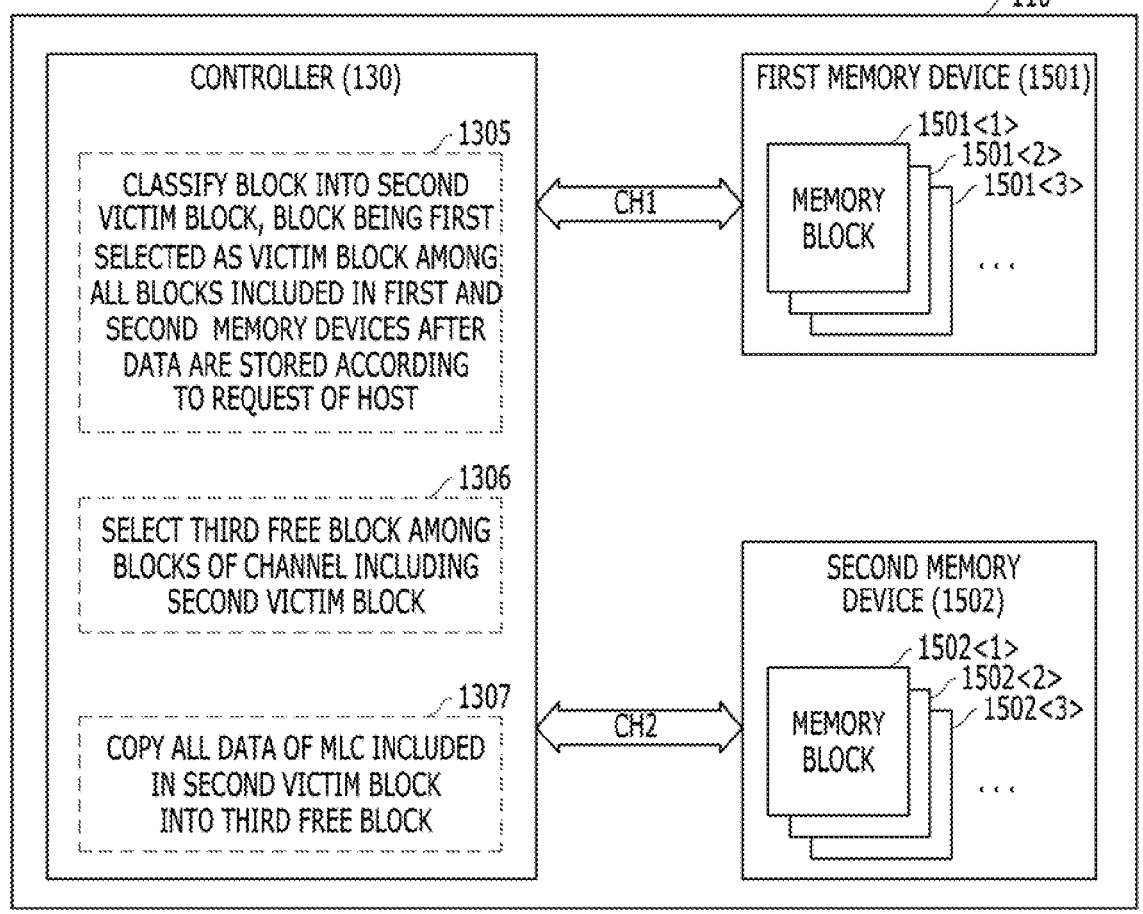

FIGS. 12A and 12B are diagrams illustrating the configuration and operation of a memory system in accordance with an embodiment of the present invention.

FIGS. 12A and 12B illustrate the configuration of the memory system 110 including a plurality of memory devices 1501 and 1502.

Referring to FIGS. 12A and 12B, the memory system 110 may include a controller 130, a first memory device 1501, and a second memory device 1502. The first and second memory devices 1501 and 1502 may include a first group of memory blocks 1501<1> to 1501<3> and a second group of memory blocks 1502<1> to 1502<3> respectively. Each of the memory blocks 1501<1> to 1501<3> and 1502<1> to 1502<3> may include multi-level cells (MLCs).

In this way, the first and second memory devices 1501 and 1502 may independently input/output data through different channels, that is, first and second channels CH1 and CH2.

The controller 130 may select one or more victim blocks in the first and second groups of memory blocks 1501<1> to 1501<3> and 1502<1> to 1502<3> for the garbage collection operation.

In an embodiment, the controller 130 may classify the selected victim blocks into first and second victim blocks. The first victim block may be one selected as the victim block for the first time after storing data in response to a host request (step 1301 in FIG. 12A). The second victim block may be the one previously selected as the target block during the previous garbage collection operation (step 1305 in FIG. 12B).

In an embodiment, the controller 130 may select first target blocks in the first and second groups of memory blocks 1501<1> to 1501<3> and 1502<1> to 1502<3>, which has the first victim blocks, for the garbage collection operation (step 1302 in FIG. 12A).

In an embodiment, the controller 130 may select second target blocks in the first and second groups of memory blocks 1501<1> to 1501<3> and 1502<1> to 1502<3>, which does not have the first victim blocks, for the garbage collection operation (step 1303 in FIG. 12A).

In an embodiment, the controller 130 may select third target blocks in the first and second groups of memory blocks 1501<1> to 1501<3> and 1502<1> to 1502<3>, which has the second victim blocks, for the garbage collection operation (step 1306 in FIG. 12B).

For example, referring to FIG. 12A, during the garbage collection operation, the controller 130 may select as the victim blocks the first and second memory blocks 1501<1> and 1501<2> in the first group of memory blocks 1501<1> to 1501<3>, and the second memory block 1502<2> in the second group of memory blocks 1502<1> to 1502<3>.

When each of the first memory block 1501<1> of the first group of memory blocks 1501<1> to 1501<3> and the second memory block 1502<2> of the second group of memory blocks 1502<1> to 1502<3> are storing data in response to a host request while the second memory block 1501<2> of the first group of memory blocks 1501<1> to 1501<3> are storing data as result of the previous garbage collection operation, the controller 130 may classify the first memory block 1501<1> of the first group of memory blocks 1501<1> to 1501<3> and the second memory block 1502<2> of the second group of memory blocks 1502<1> to 1502<3> as the first victim blocks.

For example, suppose that the first memory block 1501<1> of the first group of memory blocks 1501<1> to 1501<3> is classified as the first victim block. The controller 130 may select any empty block as the first target block in the first group of memory blocks 1501<1>to 1501<3>, which has the first victim blocks. Furthermore, the controller 130 may select any empty block as the second target block in the second group of memory blocks 1502<1> to 1502<3>, which does not have the first victim blocks.

The controller 130 may separate data stored in the MLC of the first victim block on a level basis, and copy the separated data into the first and second target blocks, respectively (step 1304 in FIG. 12A).

For example, suppose that the first memory block 1501<1> of the first group of memory blocks 1501<1> to 1501<3> is classified as the first victim block, the third memory block 1531<3> of the first group of memory blocks 1501<1> to 1501<3> is selected as the first target block, and the third memory block 1532<3> of the second group of memory blocks 1502<1> to 1502<3> is selected as the second target block. In this case, the controller 130 may copy data stored in a lower level LSB that is, least significant bit (LSB) data of the first memory block 1501<1> which is, the first victim block into the third memory block 1501<3> which is, the first target block, and copy data stored in an upper level MSB which is, a most significant bit (MSB) data of the first memory block 1501<1> into the third memory block 1502<3> which is, the second target block according to an interleaved copy policy, which will be described later, For example, referring to FIG. 12B during the garbage collection operation, the controller 130 may select as the victim blocks the first and second memory blocks 1501<1> and 1502<2> of the first group of memory blocks 1501<1> to 1501<3> and the second memory block 1502<2> of the second group of memory blocks 1502<1> to 1502<3>.

When each of the first memory block 1501<1> of the first group of memory blocks 1501<1> to 1501<3> and the second memory block 1502<2> of the second group f memory blocks 1502<1> to 1502<3> are storing data in response to a host request while the second memory block 1501<2> of the first group of memory blocks 1501<1> to 1501<3> are storing data as result of the previous garbage collection operation, the controller 130 may classify the second memory blocks 1501<2> of the first group of memory blocks 1501<1> to 1501<3> as the second victim blocks.

For example, suppose that the second memory block 1501<2> of the first group of memory blocks 1501<1> to 1501<3> is classified as the second victim block. The controller 130 may select any empty memory block as the third target block in the first group of memory blocks 1501<1> to 1501<3>, which has the second victim blocks.

The controller 130 may copy all data stored in the MLC of the second victim block into the third target block without separation of data on the level basis (1307) on an "as is" basis.

The classification of the selected victim blocks into first and second victim block (steps 1301 and 1305 in FIGS. 12A and 12B) will be described as follows.

When storing data in a memory block in response to a host request, the controller 130 may also store first identification information (not illustrated) together in a corresponding memory block.

When storing garbage-collected data in a target block as a result of the garbage collection operation,the controller 130 may also store second identification information (not illustrated) together in a corresponding target memory block.

Therefore, every memory block except for the empty blocks may store one of the first and second identification information in the first and second groups of memory blocks 1501<1> to 1501<3> and 1502<1> to 1502<3>.

Therefore, the controller 130 may classify as the first victim block the selected victim block storing the first identification information while classifying as the second victim block the selected victim block storing the second identification information.

Figure 13A:
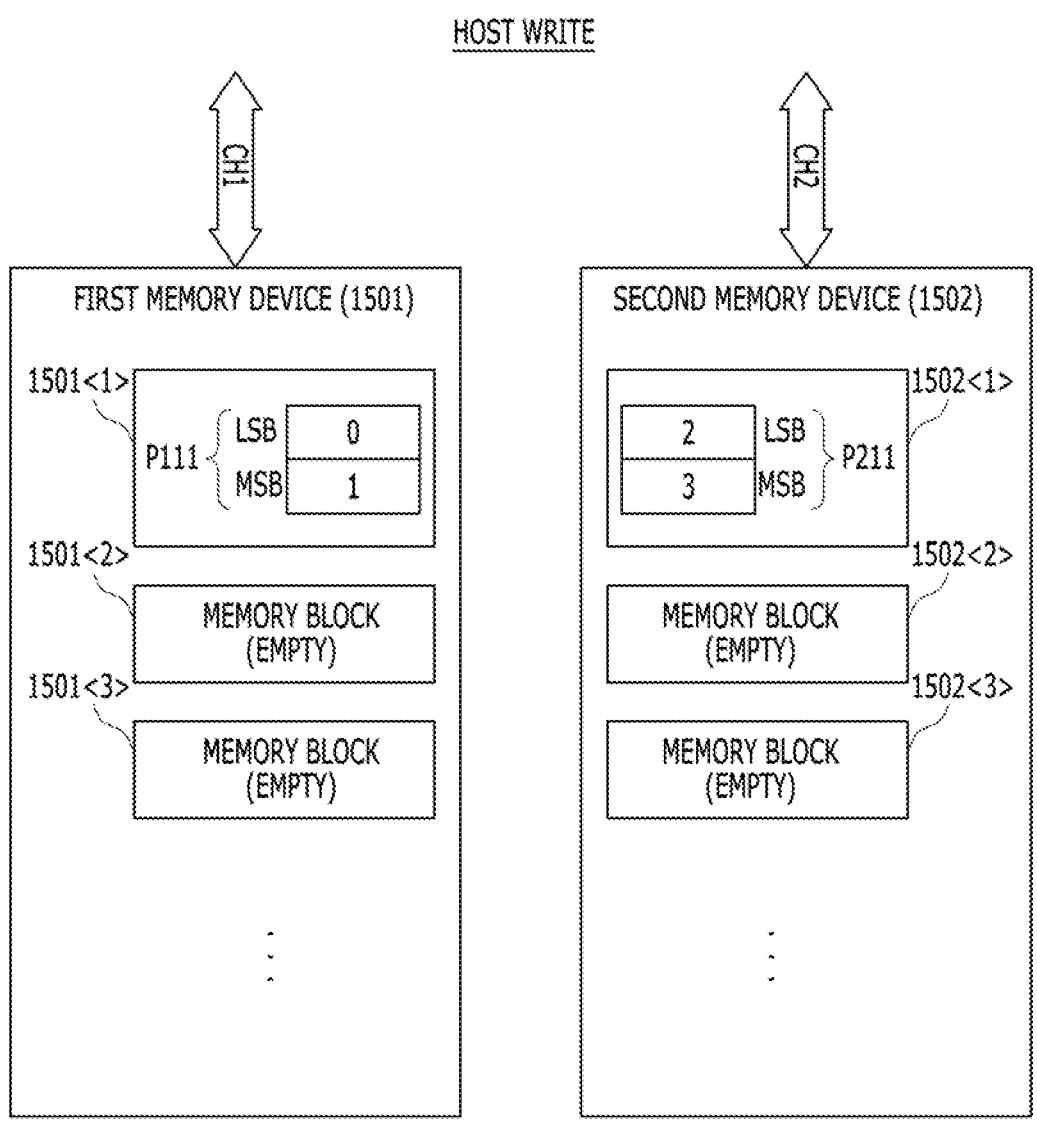
Figure 13B:
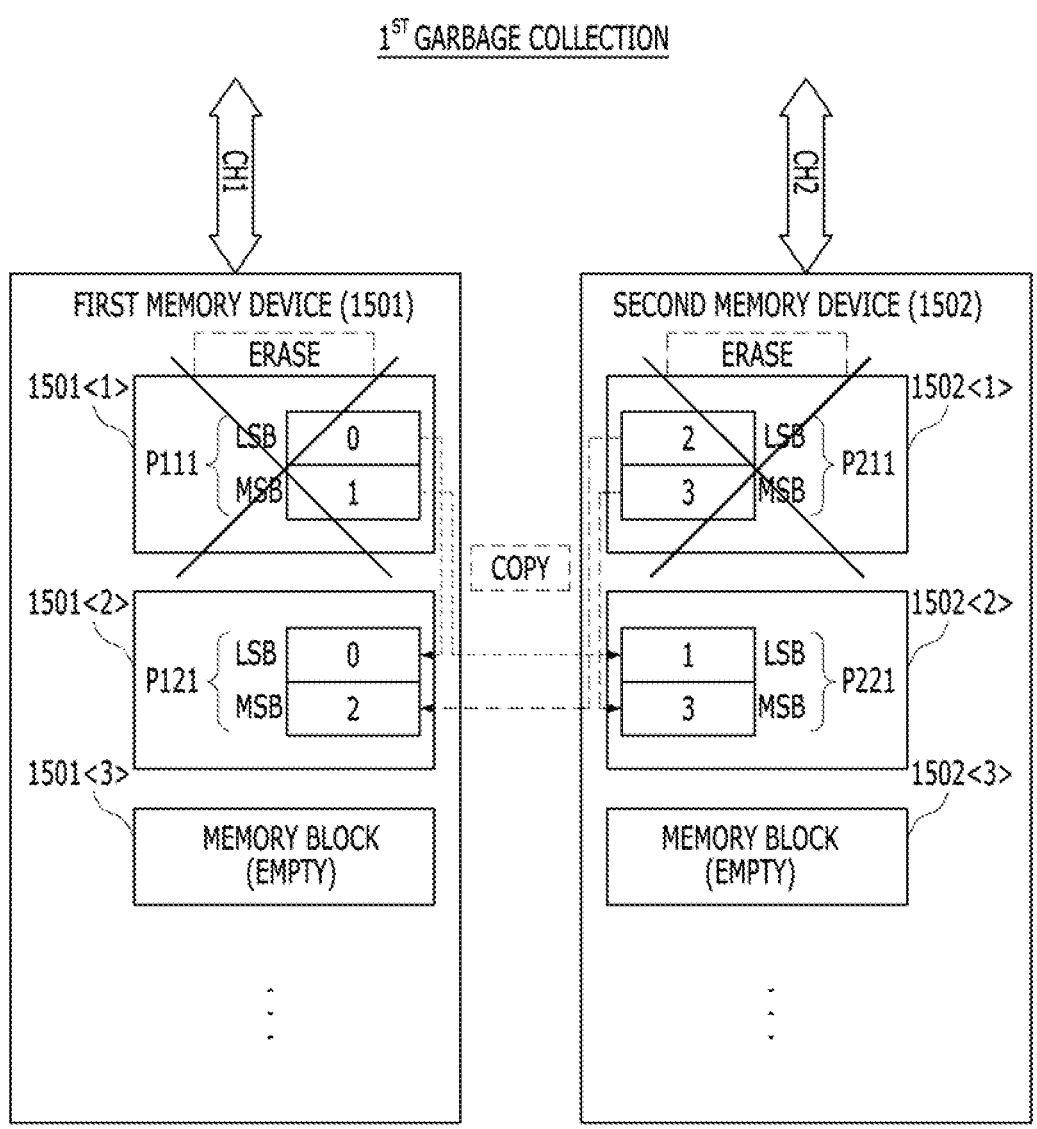

FIGS. 13A to 13C are diagrams for describing an exemplary operation of the memory system of FIGS. 12A and 12B.

FIGS. 13A to 13C show the first and second memory devices 1501 and 1502 respectively having the first and second groups of memory blocks 1501<1> to 1501<3> and 1502<1> to 1502<3> of 2-bit MLC structure.)

In an embodiment, the program operation in response to the host request that is, the program command may be performed to the first and second groups of memory blocks 1501<1> to 1501<3> and 1502<1> to 1502<3> through the one-shot program scheme. The one-shot program is well-known to those skilled in the art, and indicates an operation of storing multi-level data in a MLC at one time.

FIG. 13A exemplarily shows the first memory block 1501<1 > selected as the first victim block in the first group of memory blocks 1501<1> to 1501<3>, and the first memory block 1502<1> selected also as the first victim block in the second group of memory blocks 1502<1> to 1502<3>. FIG. 13A also exemplarily shows the other ones of the first and second groups of memory blocks 1501<1> to 1501<3> and 1502<1> to 1502<3> as empty blocks. It is assumed that the garbage collection operation is not yet performed to the first memory blocks 1501<1> and 1502<1> in the first and second groups of memory blocks 1501<1> to 1501<3> and 1502<1> to 1502<3> after the data 0, 1, 2, and 3 are stored in response to the host request.

As a result of the one-shot program, data of decimal values "0" and "1" (respectively referred to as data 0 and data 1 hereinafter) are respectively stored in lower and upper level regions LSB and MSB a first page P111 included in the first victim block or the first memory block 1501<1> of the first group of memory blocks 1501<1> to 1501<3>. Similarly as a result of the one-shot program, data of decimal values "2" and "3" respectively referred to as data 2 and data 3 hereinafter, are respectively stored in lower and upper level regions LSB and MSB, a first page P211 included in the first victim block or the first memory block 1502<1> of the second group of memory blocks 1502<1> to 1502<3>. Since each of the first and second groups of memory blocks 1501<1> to 1501<3> and 1502<1> to 1502<3> uses dedicated channels CH1 and CH2 different from each other, it is impossible to perform the interleaved read operation to the memory blocks respectively belonging to different groups of memory blocks 1501<1> to 1501<3> and 1502<1> to 1502<3>.

As illustrated in FIG. 13A, when consecutive data such as, data 0 and data 1; or data 2 and data 3 are stored in ascending order from the lower level LSB to the upper level MSB in a single memory block such as, each of the first memory blocks 1501<1> and 1502<1> due to the one-shot program operation, it is impossible to perform the interleaved read operation to the neighboring memory blocks for example, both of the first memory blocks 1501<1> and 1502<1> respectively belonging to the first and second groups of memory blocks 1501<1> to 1501<3> and 1502<1> to 1502<3> since stored data of the same level are not in a consecutive relationship between the neighboring memory blocks. For example, data 0 of the lower level LSB of the first memory block 1501<1> are not consecutive with data 2 of the lower level LSB of the first memory block 1502<1>, and neither is data 1 and data 3 of the upper level MSB between the first memory blocks 1501<1> and 1502<1>.

In short, as illustrated in FIGS. 12A, 12B, and 13A, when the first and second memory devices 1501 and 1502 including MLCs input/output data through different channels CH1 and CH2 and store data applied from the host 102 through the one-shot program, the interleaved read operation cannot be performed to plural memory blocks respectively belonged to different groups of memory blocks 1501<1> to 1501<3> and 1502<1> to 1502<3>.

The interleaved read operation may be required when the memory blocks such as, the first memory blocks 1501<1> and 1502<1>; the second memory blocks 1501<2> and 1502<2>; or the third memory blocks 1501<3> and 1502<3>, form a super block from different groups of memory blocks 1501<1> to 1501<3> and 1502<1> to 1502<3> using different channels CH1 and CH2. The super memory block may include a plurality of memory blocks included in different memory devices or different planes which are bound together and managed as a single memory block.

In accordance with an embodiment of the present invention, during the garbage collection operation, the consecutive data such as, data 0 and data 1; or data 2 and data 3 stored in a single memory block for example, each of the first memory blocks 1501<1> and 1502<1> due to the one-shot program operation, may be arranged as suitable for the interleaved read operation.

Referring to FIG. 13B after the selecting of the first victim blocks in the first and second groups of memory blocks 1501<1> to 1501<3> and 1502<1> to 1502<3> as illustrated in FIG. 13A, the controller 130 may select from the first group of memory blocks 1501<1> to 1501<3> the first target block corresponding to the first memory block 1501<1>, which is the first victim block of the first group of memory blocks 1501<1> to 1501<3>. FIG. 13B exemplarily shows the second memory block 1501<2> as the first target block in the first group of memory blocks 1501<1> to 1501<3>.

Additionally, the controller 130 may select from the second group of memory blocks 1502<1 > to 1502<3> the first target block corresponding to the second memory block 1502<1>, which is the first victim block of the second group of memory blocks 1502<1> to 1502<3>. FIG. 13B exemplarily shows the second memory block 1502<2> as the first target block in the second group of memory blocks 1502<1> to 1502<3>.

Further, the controller 130 may select from the second group of memory blocks 1502<1> to 1502<3> the second target block corresponding to the first memory block 1501<1>, which is the first victim block of the first group of memory blocks 1501<1> to 1501<3>. FIG. 13B exemplarily shows the second memory block 1502<2> as the second target block in the second group of memory blocks 1502<1> to 1502<3>.

Still further, the controller 130 may select from the first group of memory blocks 1501<1> to 1501<3> the second target block corresponding to the second memory block 1502<1>, which is the first victim block of the second group of memory blocks 1502<1> to 1502<3>. FIG. 13B exemplarily shows the second memory block 1501<2> as the second target block in the first group of memory blocks 1501<1> to 1501<3>.

As such, the second memory block 1502<2> of the second group of memory blocks 1502<1> to 1502<3> may be selected as the first target block for the first memory block 1502<1> of the same group of memory blocks that is, the second group of memory blocks 1502<1> to 1502<3>, as well as, being selected as the second target block for the first memory block 1501<1> of the different group of memory blocks that is, the first group of memory blocks 1501<1> to 1501<3>.

Similarly, the second memory block 1501<2> of the first group of memory blocks 1501<1> to 1501<3> may be selected as the first target block for the first memory block 1501<1> of the same group of memory blocks that is, the first group of memory blocks 1501<1 > to 1501<3>, as well as being selected as the second target block for the first memory block 1502<1> of the different group of memory blocks that is, the second group of memory blocks 1502<1> to 1502<3>.

For example, when the first memory blocks 1501<1> and 1502<1> of the first and second groups of memory blocks 1501<1> to 1501<3> and 1502<1> to 1502<3> are managed together as the super block, the second memory block 1501<2> of the first group of memory blocks 1501<1> to 1501<3> selected as both of the first and second target blocks for the super block in the first and second groups of memory blocks 1501<1> to 1501<3> and 1502<1> to 1502<3> may be referred to as a first common target block corresponding to the super block of the first memory blocks 1501<1> and 1502<1>.

Similarly, the second memory block 1501<2> of the second group of memory blocks 1502<1> to 1502<3> selected as both of the first and second target blocks for the super block in the first and second groups of memory blocks 1501<1> to 1501<3> and 1502<1> to 1502<3> may be referred to as a second common target block corresponding to the super block of the first memory blocks TO 1501<1> and 1502<1>.

In such case, the garbage collection operation may be performed according to the interleaved copy policy as follows.

First, data of the first victim blocks are sequentially copied out by a unit of a memory block. For example, data of the first memory block 1501<1> of the first group of memory blocks 1501<1> to 1501<3> are copied to the target blocks, and then data of the second memory block 1502<2> of the second group of memory blocks 1502<1> to 1502<3> are copied to the target blocks.

Second, in each of the first victim blocks, data are copied in ascending order from the lower level LSB to the upper level MSB. As described above with reference to FIG. 13A, the consecutive data for example data 0 and data 1; or data 2 and data 3, are stored in ascending order from the lower level LSB to the upper level MSB in each of the first victim blocks that is, each of the first memory blocks 1501 1> and 1502<1> due to the one-shot program operation. Therefore, as a result of the copy, the consecutive data may be copied out from each of the first victim blocks.

Third, the consecutively copied-out data are stored in the target blocks in order from the first common target block to the second common target block in an ascending level of MLC basis. When a certain level of all of the target blocks is full of data, the remaining copied data are stored in the next upper level of all of the target blocks.

For example, referring to FIG. 13B, data 0 and data 1 respectively stored in the first victim block or the first memory block 1501<1> of the first group of memory blocks 1501<1> to 1501<3> may be firstly copied out in ascending order from the lower level LSB to the upper level MSB. Then the consecutively copied out data 0 and data 1 may sequentially be stored in the lower level LSB of the first and second common target blocks that is, the second memory blocks 1501<2> and 1502<2>. Then data 2 and data 3 respectively stored in another first victim block or the second memory block 1502<1> of the second group of memory blocks 1502<1> to 1502<3> may be secondly copied out in ascending order from the lower level LSB and the upper level MSB. Then the consecutively copied out data 2 and data 3 may sequentially be stored in the upper level of the first and second common target blocks that is, the second memory blocks 1501<2> and 1502<2>.

When the garbage collection operation is completed as described above, the first victim blocks or the first memory blocks 1501<1> and 1502<1> may be erased.

Furthermore, upon completion of the garbage collection operation, the data 0 may be stored in the lower level LSB of the first page P121 of the first common target block or the second memory block 1501<2> of the first group of memory blocks 1501<1> to 1501<3> and the data 2 may be stored in the upper level MSB of the first page P121. Furthermore, the data 1 may be stored in the lower level LSB of the first page P221 of the second common target block or the second memory block 1502<2> of the second group of memory blocks 1502<1> to 1502<3>, and the data 3 may be stored in the upper level MSB of the first page P221.

Therefore, since the data 0 stored in the lower level LSB of the first page P121 included in the second memory block 1501<2> of the first: group of memory blocks 1501<1> to 1501<3> and the data 1 stored in the lower level LSB of the first page P221 included in the second memory block 1502<2> of the second group of memory blocks 1502<1> to 1502<3> have consecutive values, the interleaved read operation can be performed. Similarly, since the data 2 stored in the upper level MSB of the first page P121 included in the second memory block 1501<2> of the first group of memory blocks 1501<1> to 1501<3> and the data 3 stored in the upper level MSB of the first page P221 included in the second memory block 1502<2> of the second group of memory blocks 1502<1> to 1502<3> have consecutive values the interleaved read operation can be performed.

In accordance with an embodiment of the present invention, upon completion of a data arrangement suitable for the interleaved read operation as described with reference to FIG. 13B, the controller 130 may keep the arrangement of data unchanged despite subsequent garbage collection operations.

FIG. 13C illustrates the subsequent garbage collection operation after the previous garbage collection operation as illustrated in FIG. 13B.

Referring to FIG. 13C, upon completion of the previous garbage collection operation described with reference to FIG. 13B, the first and second common target memory block or the second memory blocks 1501<2> and 1502<2> of the first group of memory blocks 1501<1> to 1501<3> may store the data in the ascending level of MLC basis for the interleaved read operation as a result of the previous garbage collection operation as illustrated in FIG. 13B. For example, the consecutive data 0 and data 1 are stored in the lower level LSB of the pages P121 and P221 in the second memory blocks 1501<2> and 1502<2> while the consecutive data 2 and data 3 are stored in the upper level MSB of the pages P121 and P221 in the second memory blocks 1501<2> and 1502<2>. The super block of the first memory blocks 1501<1>and 1502<1> are erased and thus empty blocks. The super block of the third memory blocks 1501<3> and 1502<3> are still empty blocks.

In FIG. 13C, when the controller 130 selects the second memory blocks 1501<2> and 1502<2> as the victim blocks for the subsequent garbage collection operation in the first and second groups of memory blocks 1501<1> to 1501<3> and 1502<1> to 1502<3>, the controller 130 may classify the second memory blocks 1501<2> and 1502<2> into the second victim block since the second memory blocks 1501<2> and 1502<2> and the second memory block 1502<2> of the second group of memory blocks 1502<1> to 1502<3> are selected as the target blocks during the previous garbage collection operation.

Additionally, the controller 130 may select empty memory blocks as the third target blocks in the first and second groups of memory blocks 1501<1> to 1501<3> and 1502<1> to 1502<3>, each of which has the second victim block. For example, the controller may select the third memory blocks 1501<3> and 1502<3> as the third target blocks for the second victim blocks or the second memory blocks 1501<2> and 1502<2> in the first and second groups of memory blocks 1501<1> to 1501<3> and 1502<1> to 1502<3> respectively, Thus, without data arrangement as described with reference to FIG. 13B, all data of MLCs included in the second victim blocks or the second memory blocks 1501<2> and 1502<2> of the first and second groups of memory blocks 1501<1> to 1501<3> and 1502<1> to 1502<3> may be copied into MLCs included in the third target blocks or the third memory blocks 1501<3> and 1502<3> of the first and second groups of memory blocks 1501<1>to 1501<3> and 1502<1> to 1502<3>, respectively.

For example, the data 0 and data 1 stored in the lower level LSB of the first pages P121 and P221 included in the second victim blocks or the second memory blocks 1501<2> and 1502<2> of the first and second groups of memory blocks 1501<1> to 1501<3> and 1502<1> to 1502<3> may be coped into the lower level LSB of the first pages P131 and P231 included in the third target blocks or the third memory blocks 1501<3> and 1502<3> of the first and second groups of memory blocks 1501<1> to 1501<3> and 1502<1> to 1502<3>, respectively. Furthermore, the data 2 and data 3 stored in the upper level MSB of the first pages P121 and P221 included in the second victim blocks or the second memory blocks 1501<2> and 1502<2> of the first and second groups of memory blocks 1501<1> to 1501<3> and 1502<1> to 1502<3> may be coped into the upper level LSB of the first pages P131 and P231 included in the third target blocks or the third memory blocks 1501<3> and 1502<3> of the first and second groups of memory blocks 1501<1> to 1501<3> and 1502<1> to 1502<3>, respectively.

When the garbage collection operation is completed as described above, the contents of the second victim blocks or the second memory blocks 1501<2> and 1502<3> of the first and second groups of memory blocks 1501<1> to 1501<3> and 1502<1> to 1502<3> may be erased.

When the garbage collection operation with the second victim blocks is completed without data arrangement as described with reference to FIG. 13B, the data 0 may be stored in the lower level LSB of the first page P131 of the second common target block or the third memory block 1501<3> of the first group of memory blocks 1501<1> to 1501<3> and the data 2 may be stored in the upper level MSB of the first page P131. Furthermore, the data 1 may be stored in the lower level LSB of the first page P231 of the fourth common target block or the third memory block 1502<3> of the second group of memory blocks 1502<1> to 1502<3>, and the data 3 may be stored in the upper level MSB of the first page P231.

Therefore, since the data 0 stored in the lower level LSB of the first page P131 included in the third memory block 1501<3> of the first group of memory blocks 1501<1> to 1501<3> and the data 1 stored in the lower level LSB of the first page P231 included in the third memory block 1502<3> of the second group of memory blocks 1502<1> to 1502<3> have consecutive values, the interleaved read operation can be performed. Similarly, since the data 2 stored in the upper level MSB of the first page P131 included in the third memory block 1501<3> of the first group of memory blocks 1501<1> to 1501<3> and the data 3 stored in the upper level MSB of the first page P231 included in the third memory block 1502<3> of the second group of memory blocks 1502<1> to 1502<3> have consecutive values, the interleaved read operation can be performed.

In this way, since the garbage collection operation is performed to the second victim block without data arrangement as described with reference to FIG. 13B, which is different from the garbage collection operation to the first victim block with data arrangement of FIG. 13B, after the garbage collection operation of FIG. 13B is completed, the interleaved read operation can be performed. That is, once data arrangement suitable for the interleaved read operation is completed as described with reference to FIG. 13B, the controller 130 may keep the arrangement of data unchanged despite subsequent garbage collection operations.

Figure 14:
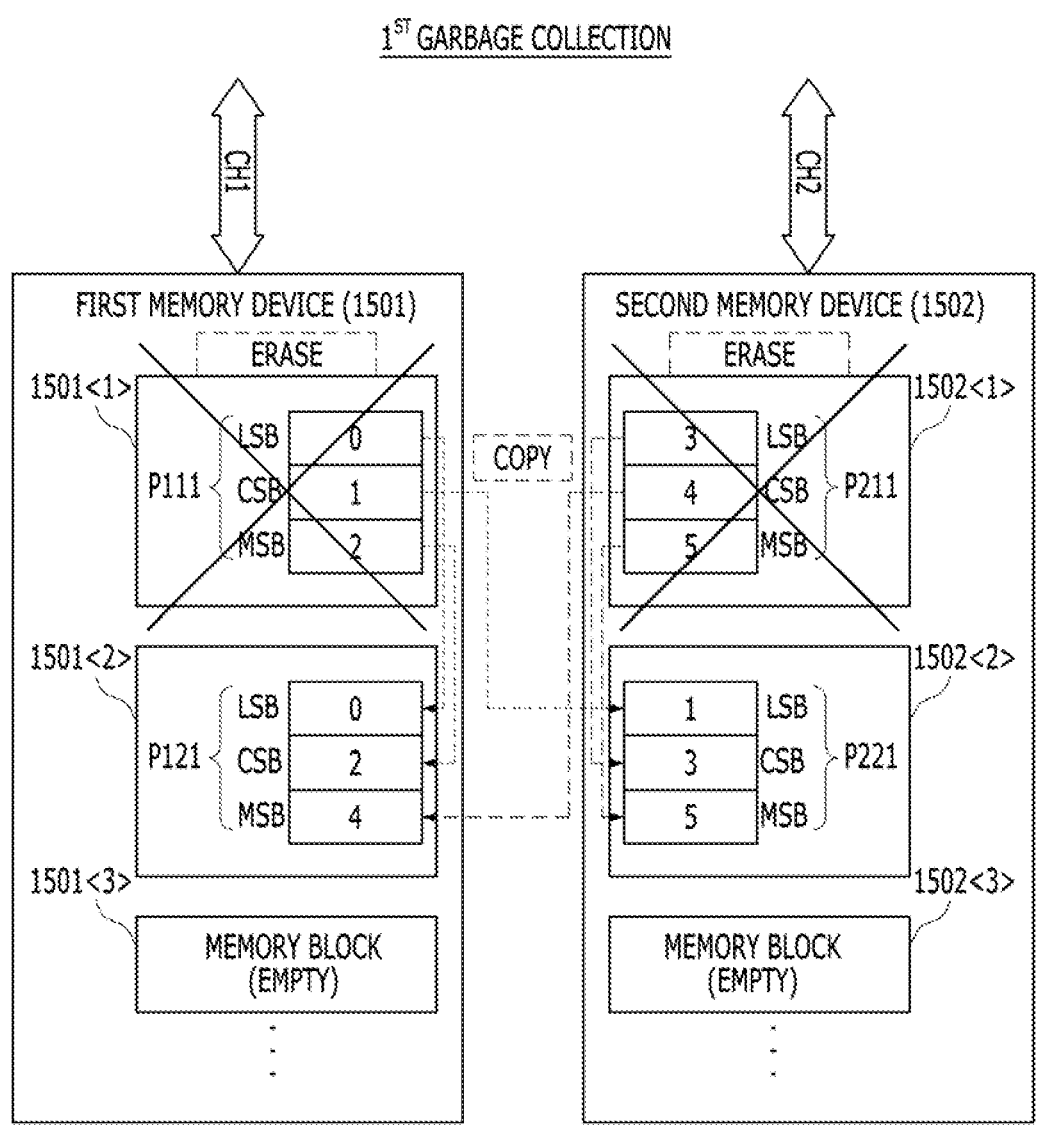
FIG. 14 is a diagram for describing another exemplary operation of the memory system of FIG. 12A.

FIG. 14 is a diagram for describing another exemplary operation of the memory system of FIG. 12A.

The first and second groups of memory blocks 1501<1> to 1501<3> and 1502<1> to 1502<3> of FIG. 14 may be the same as the first and second groups of memory blocks 1501<1> to 1501<3> and 1502<1> to 1502<3> of FIG. 13B except that the first and second groups of memory blocks 1501<1> to 1501<3> and 1502<1> to 1502<3> have 3-bit TLC structure and thus respective pages P111 to P221 have the lower level LSB, the upper level MSB, and a middle level CSB.

In such case, the garbage collection operation may be performed according to a copy policy as follows.

First, data of the first victim blocks are sequentially copied out by a unit of a memory block. For example, data of the first memory block 1501<1> of the first group of memory blocks 1501<1> to 1501<3> are copied to the target blocks, and then data of the second memory block 1502<2> of the second group of memory blocks 1502<1> to 1502<3> are copied to the target blocks.

Second, in each of the first victim blocks, data are copied in ascending order from the lower level LSB to the upper level MSB. As described above with reference to FIG. 13A, the consecutive data such as, data 0 to data 2; or data 3 and data 5, are stored in ascending order from the lower level LSB to the upper level MSB in each of the first victim blocks such as, each of the first memory blocks 1501<1> and 1502<1> due to the one-shot program operation. Therefore, as a result of the copy, the consecutive data may be copied out from each of the first victim blocks.

Third, the consecutively copied-out data are stored in the target blocks in order from the first common target block to the second common target block in an ascending level of MLC basis. When a certain level of all of the target blocks is full of data, the remaining copied data are stored in the next upper level of all of the target blocks.

For example, referring to FIG. 14, data 0 to data 2 respectively stored in the first victim block or the first memory block 1501<1> of the first group of memory blocks 1501<1> to 1501<3> may be firstly copied out in ascending order from the lower level LSB to the upper level MSB. Then, the consecutively copied out data 0 to data 2 may sequentially be stored in the lower level LSB of the first and second common target blocks that is, the second memory blocks 1501<2> and 1502<2>. When the lower level LSB of all of the second memory blocks 1501<2> and 1502<2> is full with data 0 and data 1, the remaining copied data 2 may be stored in the middle level CSB of all of the target blocks. Then data 3 and data 5 respectively stored in another first victim block or the second memory block 1502<1> of the second group of memory blocks 1502<1> to 1502<3> may be secondly copied out in ascending order from the lower level LSB and the upper level MSB. Then, the consecutively copied out data 3 and data 5 may sequentially be stored in the middle level CSB of the first and second common target blocks that is, the second memory blocks 1501<2> and 1502<2>. When the middle level CSB of all of the second memory blocks 1501<2> and 1502<2> is full with data 2 and data 3, the remaining copied data 4 and data 5 may be stored in the upper level MSB of all of the target blocks.

When the garbage collection operation is completed as described above, the first victim blocks or the first memory blocks 1501<1> and 1502<1> may be erased.

Therefore, since the data 0 stored in the lower level LSB of the first page P121 included in the second memory block 1501<2>of the first group of memory blocks 1501<1> to 1501<3> and the data 1 stored in the lower level LSB of the first page P221 included in the second memory block 1502<2> of the second group of memory blocks 1502<1> to 1502<3> have consecutive values, the interleaved read operation can be performed. Similarly, since the data 2 stored in the middle level CSB of the first page P121 included in the second memory block 1501<2> of the first group of memory blocks 1501<1> to 1501<3> and the data 3 stored in the middle level CSB of the first page P221 included in the second memory block 1502<2> of the second group of memory blocks 1502<1> to 1502<3> have consecutive values, the interleaved read operation can be performed. Further, since the data 4 stored in the upper level MSB of the first page P121 included in the second memory block 1501<2> of the first group of memory blocks 1501<1> to 1501<3> and the data 5 stored in the upper level MSB of the first page P221 included in the second memory block 1502<2> of the second group of memory blocks 1502<1> to 1502<3> have consecutive values the interleaved read operation can be performed.

After the garbage collection operation is completed the controller 130 can read data from the first common target block or the second memory block 1501<2> of the first group of memory blocks 1501<1> to 1501<3> through the first channel CH1, and can read data from the second common target block or the second memory block1502<2> of the second group of memory blocks 1502<1> to 1502<3> through the second channel CH2, according to the channel interleaving method.

In accordance with the embodiments of the present invention, when performing a garbage collection operation on a memory device which input/output data through different channels, the memory system and the operation method thereof may classify a plurality of blocks included in the respective memory devices into 'blocks selected for the first time as victim blocks' and 'blocks selected two or more times as victim blocks' after data are stored according to a request from the host, and perform the garbage collection operation in different manners depending on the classification.

Through this process, the memory devices of different channels, between which an interleaved read operation cannot be performed, can perform an interleaved read operation after the garbage collection operation is performed.

Although various embodiments have been described for illustrative purposes it will be apparent to those skilled in the art that various changes and modifications may be made without departing from the spirit and scope of the invention as defined in the following claims.

What is claimed is:
1. A memory system comprising:
a first group of multi-level cell (MLC) structured memory blocks, in which data are stored by an one-shot program operation, and operable through a first channel;
a second group of MLC structured memory blocks, in which data are stored by the one-shot program operation, and operable through a second channel different from the first channel; and
a controller suitable for:
performing a first garbage collection operation to first victim blocks and first and second target blocks in the first and second groups; and
performing a second garbage collection operation to second victim blocks and third target blocks in the first and second groups after the first garbage collection operation,
wherein, during the first garbage collection operation, copy data of the first victim blocks are interleaved and stored in the first and second target blocks such that the copy data stored in the first and second target blocks are suitable for an interleaved read operation, and
wherein, during the second garbage collection operation, copy data of the second victim blocks are stored as is in the third target blocks such that the copy data stored in the third target blocks are still suitable for the interleaved read operation.

2. The memory system of claim 1, wherein, during the first garbage collection operation, the controller sequentially copies the data of the first victim blocks by a unit of a memory block in the first and second groups.

3. The memory system of claim 2, wherein, during the first garbage collection operation, in each of the first victim blocks, the controller copies out the data of the first victim blocks in ascending order from a lower level to an upper level of the respective MLCs in the first and second groups.

4. The memory system of claim 3, wherein, during the first garbage collection operation, the controller stores the copied-out data in the target blocks in order from the first target block to the second target block in an ascending level of MLC basis.

5. The memory system of claim wherein, when storing data in a first memory block of the first and second groups in response to a host request, the controller stores a first identification information in the first memory block.

6. The memory system of claim 5, wherein, when storing data in a second memory block of the first and second groups as a result of the first garbage collection operation, the controller store a second identification information in the second memory block.

7. The memory system of claim 5, wherein, during the first garbage collection operation, the controller selects the first victim blocks in the first and second groups according to the first identification information.

8. The memory system of claim 6, wherein, during the second garbage collection operation, the controller selects the second victim blocks in the first and second groups according to the second identification information.

9. The memory system of claim 1,
wherein the controller selects the first target blocks in one of the first and second groups, to which the first victim blocks belong, and
wherein the controller selects the second target blocks in the other one of the first and second groups, to which the first victim blocks belong.

10. The memory system of claim 1, wherein the controller selects the third target blocks in one of the first and second groups, to which the second victim blocks belong.

11. An operation method of a memory system including a first group of multi-level cell (MLC) structured memory blocks in which data are stored by an one-shot program operation and operable through a first channel, and a second group of MLC structured memory blocks in which data are stored by the one-shot program operation and operable through a second channel different from the first channel, the operation method comprising:
performing a first garbage collection operation to first victim blocks and first and second target blocks in the first and second groups; and
performing a second garbage collection operation to second victim blocks and third target blocks in the first and second groups after the first garbage collection operation,
wherein the performing of the first garbage collection operation interleaves and stores copy data of the first victim blocks in the first and second target blocks such that the copy data stored in the first and second target blocks are suitable for an interleaved read operation, and wherein the performing of the second garbage collection operation, copy data of the second victim blocks are stored as is in the third target blocks such that the copy data stored in the third target blocks are still suitable for the interleaved read operation.

12. The operation method of claim 11, wherein the performing of the first garbage collection operation sequentially copies the data of the first victim blocks by a unit of a memory block in the first and second groups.

13. The operation method of claim 12, wherein the performing of the first garbage collection operation in each of the first victim blocks, copies out the data of the first victim blocks in ascending order from a lower level to an upper level of the respective MLCs in the first and second groups.

14. The operation method of claim 13, wherein the performing of the first garbage collection operation stores the copied-out data in the target blocks in order from the first target block to the second target block in an ascending level of MLC basis.

15. The operation method of claim 11, further comprising, when, storing data in a first memory block of the first and second groups in response to a host request, storing a first identification information in the first memory block.

16. The operation method of claim 15, further comprising, when storing data in a second memory block of the first and second groups as a result of the first garbage collection operation, storing a second identification information in the second memory block.

17. The operation method of claim 15, wherein the performing of the first garbage collection operation selects the first victim blocks in the first and second groups according to the first identification information.

18. The operation method of claim 16, wherein the performing of the second garbage collection operation selects the second victim blocks in the first and second groups according to the second identification information.

19. The operation method of claim 11,
wherein the performing of the first garbage collection operation selects the first target blocks in one of the first and second groups, to which the first victim blocks belong, and
wherein the performing of the first garbage collection operation selects the second target blocks in the other one of the first and second groups, to which the first victim blocks belong.

20. The operation method of claim 11, wherein the performing of the second garbage collection operation selects the third target blocks in one of the first and second groups, to which the second victim blocks belong.

* * * * *